United States Patent
Mieno

(10) Patent No.: US 8,951,871 B2
(45) Date of Patent: Feb. 10, 2015

(54) SEMICONDUCTOR DEVICE AND MANUFACTURING METHOD THEREOF

(75) Inventor: Fumitake Mieno, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/326,322

(22) Filed: Dec. 15, 2011

(65) Prior Publication Data

US 2013/0020613 A1   Jan. 24, 2013

(30) Foreign Application Priority Data

Jul. 19, 2011   (CN) .......................... 2011 1 0201273
Jul. 19, 2011   (CN) .......................... 2011 1 0201414

(51) Int. Cl.
*H01L 29/66* (2006.01)
*H01L 21/336* (2006.01)
(Continued)

(52) U.S. Cl.
CPC .... *H01L 29/66545* (2013.01); *H01L 29/41783* (2013.01); *H01L 29/6659* (2013.01);
(Continued)

(58) Field of Classification Search
CPC ................... H01L 29/66636; H01L 29/7848; H01L 29/4842; H01L 29/66545; H01L 29/66628
USPC .......... 257/192, 344, 347, E21.409, E21.411, 257/E21.633, E21.644, E29.122, E29.255; 438/285, 299, 300, 303, 706, 718
See application file for complete search history.

(56) References Cited

U.S. PATENT DOCUMENTS

| 6,605,498 B1 | 8/2003 | Murthy et al. |
| 2004/0097047 A1* | 5/2004 | Natzle et al. .................. 438/300 |

(Continued)

FOREIGN PATENT DOCUMENTS

| CN | 1525542 A | 9/2004 |
| CN | 1898785 A | 1/2007 |

(Continued)

OTHER PUBLICATIONS

Chemical vapour etching of Si, SiGe and Ge with HCl; applications to the formation of thin relaxed SiGe buffers and to the revelation of threading dislocations; Y Bogumilowicz, J M Hartmann, R Truche, Y Campidelli, G Rolland and T Billon 2005 Semicond. Sci. Technol. 20, 127-134.*

*Primary Examiner* — Fernando L Toledo
*Assistant Examiner* — Aaron Gray
(74) *Attorney, Agent, or Firm* — Innovation Counsel LLP

(57) ABSTRACT

This disclosure relates to a semiconductor device and a manufacturing method thereof. The semiconductor device comprises: a patterned stacked structure formed on a semiconductor substrate, the stacked structure comprising a silicon-containing semiconductor layer overlaying the semiconductor substrate, a gate dielectric layer overlaying the silicon-containing semiconductor layer and a gate layer overlaying the gate dielectric layer; and a doped epitaxial semiconductor layer on opposing sides of the silicon-containing semiconductor layer forming raised source/drain extension regions. Optionally, the silicon-containing semiconductor layer may be used as a channel region. According to this disclosure, the source/drain extension regions can be advantageously made to have a shallow junction depth (or a small thickness) and a high doping concentration.

22 Claims, 7 Drawing Sheets

(51) Int. Cl.
  *H01L 29/417* (2006.01)
  *H01L 29/78* (2006.01)
  *H01L 29/10* (2006.01)
  *H01L 29/165* (2006.01)
  *H01L 29/49* (2006.01)
  *H01L 29/51* (2006.01)

(52) U.S. Cl.
  CPC .... *H01L29/66621* (2013.01); *H01L 29/66636* (2013.01); *H01L 29/7833* (2013.01); *H01L 29/7834* (2013.01); *H01L 29/1054* (2013.01); *H01L 29/165* (2013.01); *H01L 29/495* (2013.01); *H01L 29/4966* (2013.01); *H01L 29/517* (2013.01)
  USPC ................... 438/285; 257/192; 257/E29.255; 257/E21.409; 438/299; 438/300

(56) References Cited

U.S. PATENT DOCUMENTS

| | | | |
|---|---|---|---|
| 2005/0272187 A1* | 12/2005 | Murthy et al. | 438/151 |
| 2006/0068590 A1* | 3/2006 | Lindert et al. | 438/689 |
| 2006/0286755 A1* | 12/2006 | Brask et al. | 438/299 |
| 2009/0032841 A1* | 2/2009 | Eller et al. | 257/190 |
| 2009/0085129 A1* | 4/2009 | Majhi et al. | 257/402 |
| 2009/0242936 A1* | 10/2009 | Cheng et al. | 257/190 |
| 2009/0315116 A1* | 12/2009 | Sakuma | 257/368 |

FOREIGN PATENT DOCUMENTS

| | | |
|---|---|---|
| CN | 101027763 A | 8/2007 |
| CN | 101170079 A | 4/2008 |
| CN | 101268547 A | 9/2008 |
| CN | 101622690 A | 1/2010 |

* cited by examiner

SEMICONDUCTOR DEVICE AND MANUFACTURING METHOD THEREOF

CROSS-REFERENCES TO RELATED APPLICATIONS

This application claims priority to Chinese Patent Application No. 201110201414.7 filed on Jul. 19, 2011 and entitled "Semiconductor Device and Manufacturing Method thereof" and Chinese Patent Application No. 201110201273.9 filed on Jul. 19, 2011 and entitled "Semiconductor Device and Manufacturing Method Thereof", which are incorporated herein by reference in their entirety.

BACKGROUND OF THE INVENTION

1. Field of the Invention

This disclosure relates to a semiconductor device and a manufacturing method thereof. This disclosure in particular relates to a semiconductor device with epitaxial source/drain extension regions and a manufacturing method thereof.

2. Description of the Related Art

Nowadays, millions of semiconductor devices are integrated together to form very large scale integrated circuits.

FIG. 1 shows a sectional view of a conventional semiconductor device (transistor). The transistor generally comprises a gate dielectric layer 140 on a semiconductor substrate and a gate layer 150 on the gate dielectric layer 140. Sidewall spacers 160 and 165 are formed on sidewalls of the gate dielectric layer 140 and the gate layer 150. The transistor generally also comprises a pair of source/drain regions 110 on opposing sides of the gate layer 150. In addition, a pair of source/drain extension regions 120 is formed in the surface region of the semiconductor substrate, and extends beneath the gate dielectric layer 140 and the gate layer 150. A channel region 130 is formed in the semiconductor substrate between the pair of source/drain extension regions 120 and beneath the gate dielectric layer 140.

With the continuous shrink of the critical size of the transistor, it is desired for the source/drain extension regions 120 to have a shallow junction depth (or a small thickness) so as to reduce the area junction capacitance, and it is also desired for the source/drain extension regions 120 to have a high activated dopant concentration so as to reduce the accumulation resistance, thereby the driving current of the transistor is increased.

For the above purposes, annealing, especially laser melting/sub-melting annealing, is generally applied to the source/drain extension regions formed by ion implantation.

However, the present inventor has conducted in-depth investigation on this, and has found that further improvement is still expected on the junction depth and activated dopant concentration of the source/drain extension regions formed by ion implantation and laser melting/sub-melting annealing. Incidentally, although SIMS (Secondary Ion Mass Spectrometry) is generally used to measure dopant profiles after laser melting/sub-melting annealing, SIMS is unable to distinguish whether dopants are activated or not.

Therefore, the present inventor has recognized that there is a need for a semiconductor device, which has source/drain extension regions with a shallow junction depth (or a small thickness) and a high activated dopant concentration, and a manufacturing method thereof.

BRIEF SUMMARY OF THE INVENTION

This disclosure is proposed in view of the above problems.

An object of this disclosure is to provide a semiconductor device, which has source/drain extension regions with a shallow junction depth (or a small thickness) and a high activated dopant concentration, and a manufacturing method thereof.

According to a first aspect of this disclosure, there is provided a semiconductor device, comprising: a patterned stacked structure formed on a semiconductor substrate, the stacked structure comprising a silicon-containing semiconductor layer overlaying the semiconductor substrate and forming a channel region, a gate dielectric layer overlaying the silicon-containing semiconductor layer and a gate layer overlaying the gate dielectric layer; and a doped epitaxial semiconductor layer on opposing sides of the silicon-containing semiconductor layer forming raised source/drain extension regions.

Preferably, a doping concentration of the epitaxial semiconductor layer is about $5.0 \times 10^{19}$ to $5.0 \times 10^{21}$ cm$^{-3}$.

Preferably, a thickness of the epitaxial semiconductor layer is about 5 to 50 nm.

Preferably, the silicon-containing semiconductor layer is a SiGe layer and the Ge concentration is about 30 to 40 atomic-percent.

Preferably, the semiconductor device is a PMOS transistor.

Preferably, the epitaxial semiconductor layer is a Si layer.

Preferably, opposing ends of the silicon-containing semiconductor layer are undercut with respect to the gate dielectric layer and a total undercut length of the silicon-containing semiconductor layer is about 10 to 20 percent of a gate length.

Preferably, the gate dielectric layer and the gate layer are replaced with a high-K gate dielectric layer and a metal gate layer respectively.

Preferably, the high-K gate dielectric layer is substantially U-shaped, and the metal gate layer is partially surrounded by the high-K gate dielectric layer.

According to a second aspect of this disclosure, there is provided a manufacturing method of a semiconductor device, comprising the following steps: forming a patterned stacked structure on a semiconductor substrate, the stacked structure comprising a silicon-containing semiconductor layer overlaying the semiconductor substrate, a gate dielectric layer overlaying the silicon-containing semiconductor layer and a gate layer overlaying the gate dielectric layer; selectively epitaxially growing a doped epitaxial semiconductor layer on opposing sides of the silicon-containing semiconductor layer so as to form raised source/drain extension regions; and replacing the gate dielectric layer and the gate layer with a high-K gate dielectric layer and a metal gate layer respectively, and leaving the silicon-containing semiconductor layer to be used as a channel region.

Preferably, a doping concentration of the epitaxial semiconductor layer is about $5.0 \times 10^{19}$ to $5.0 \times 10^{21}$ cm$^{-3}$.

Preferably, a thickness of the epitaxial semiconductor layer is about 5 to 50 nm.

Preferably, the silicon-containing semiconductor layer is a SiGe layer and the Ge concentration is about 30 to 40 atomic-percent.

Preferably, the semiconductor device is a PMOS transistor.

Preferably, the epitaxial semiconductor layer is a Si layer.

Preferably, the selective epitaxial growth conditions include a H2 flow rate of about 10 to 50 slm, a Si source flow rate of about 100 to 300 sccm, a HCl flow rate of about 50 to 300 sccm, a flow rate of about 100 to 500 sccm of a mixture of AsH3 and H2 with a molar ratio of about 1:99, a mixture of $B_2H_6$ and $H_2$ with a molar ratio of about 1:99 or a mixture of PH3 and $H_2$ with a molar ratio of about 1:99, a temperature of about 620 to 800° C., and a pressure of about 0.1 to 1.0 Torr.

Preferably, the manufacturing method further comprises the following step: etching the silicon-containing semiconductor layer after forming the stacked structure and before forming the raised source/drain extension regions so as to undercut opposing ends of the silicon-containing semiconductor layer with respect to the gate dielectric layer, wherein a total undercut length of the silicon-containing semiconductor layer is about 10 to 20 percent of a gate length.

Preferably, the silicon-containing semiconductor layer is a SiGe layer, and the Ge concentration is about 30 to 40 atomic-percent; and the etching is performed by HCl vapor phase etching, wherein a mixed gas of HCl and $H_2$ is used, the partial pressure of HCl is about 0.1 to 0.9 Torr, the total pressure is not higher than about 80 Torr, and the temperature is about 500 to 700° C.

Preferably, the replacing step comprises the following steps: forming sidewall spacers of the stacked structure; removing the gate layer and the gate dielectric layer so as to form a trench between the sidewall spacers; forming the high-K gate dielectric layer covering the bottom and sidewalls of the trench; and forming the metal gate layer partially surrounded by the high-K gate dielectric layer.

Preferably, the manufacturing method further comprises the following step: forming source/drain regions after forming the sidewall spacers.

According to a third aspect of this disclosure, there is provided a semiconductor device, comprising: a patterned stacked structure formed on a semiconductor substrate, the stacked structure comprising a silicon-containing semiconductor layer overlaying the semiconductor substrate, a gate dielectric layer overlaying the silicon-containing semiconductor layer and a gate layer overlaying the gate dielectric layer; and a doped epitaxial semiconductor layer on opposing sides of the silicon-containing semiconductor layer forming raised source/drain extension regions.

Preferably, a doping concentration of the epitaxial semiconductor layer is about $5.0 \times 10^{19}$ to $5.0 \times 10^{21}$ $cm^{-3}$.

Preferably, a thickness of the epitaxial semiconductor layer is about 5 to 50 nm.

Preferably, the silicon-containing semiconductor layer is a SiGe layer and the Ge concentration is about 30 to 40 atomic-percent.

Preferably, the epitaxial semiconductor layer is a Si layer.

Preferably, opposing ends of the silicon-containing semiconductor layer are undercut with respect to the gate dielectric layer and a total undercut length of the silicon-containing semiconductor layer is about 10 to 20 percent of a gate length.

Preferably, the silicon-containing semiconductor layer, the gate dielectric layer and the gate layer are replaced with a high-K gate dielectric layer overlaying the semiconductor substrate and a metal gate layer overlaying the high-K gate dielectric layer.

Preferably, the high-K gate dielectric layer is substantially U-shaped, and the metal gate layer is partially surrounded by the high-K gate dielectric layer.

According to a fourth aspect of this disclosure, there is provided a manufacturing method of a semiconductor device, comprising the following steps: forming a patterned stacked structure on a semiconductor substrate, the stacked structure comprising a silicon-containing semiconductor layer overlaying the semiconductor substrate, a gate dielectric layer overlaying the silicon-containing semiconductor layer and a gate layer overlaying the gate dielectric layer; and selectively epitaxially growing a doped epitaxial semiconductor layer on opposing sides of the silicon-containing semiconductor layer so as to form raised source/drain extension regions.

Preferably, a doping concentration of the epitaxial semiconductor layer is about $5.0 \times 10^{19}$ to $5.0 \times 10^{21}$ $cm^{-3}$.

Preferably, a thickness of the epitaxial semiconductor layer is about 5 to 50 nm.

Preferably, the silicon-containing semiconductor layer is a SiGe layer and the Ge concentration is about 30 to 40 atomic-percent.

Preferably, the epitaxial semiconductor layer is a Si layer.

Preferably, the selective epitaxial growth conditions include a $H_2$ flow rate of about 10 to 50 slm, a Si source flow rate of about 100 to 300 sccm, a HCl flow rate of about 50 to 300 sccm, a flow rate of about 100 to 500 sccm of a mixture of AsH3 and H2 with a molar ratio of about 1:99, a mixture of $B_2H_6$ and $H_2$ with a molar ratio of about 1:99 or a mixture of $PH_3$ and $H_2$ with a molar ratio of about 1:99, a temperature of about 620 to 800° C., and a pressure of about 0.1 to 1.0 Torr.

Preferably, the manufacturing method further comprises the following step: etching the silicon-containing semiconductor layer after forming the stacked structure and before forming the raised source/drain extension regions so as to undercut opposing ends of the silicon-containing semiconductor layer with respect to the gate dielectric layer, wherein a total undercut length of the silicon-containing semiconductor layer is about 10 to 20 percent of a gate length.

Preferably, the silicon-containing semiconductor layer is a SiGe layer, and the Ge concentration is about 30 to 40 atomic-percent; and the etching is performed by HCl vapor phase etching, wherein a mixed gas of HCl and H2 is used, the partial pressure of HCl is about 0.1 to 0.9 Torr, the total pressure is not higher than about 80 Torr, and the temperature is about 500 to 700° C.

Preferably, the manufacturing method further comprises the following step: replacing the silicon-containing semiconductor layer, the gate dielectric layer and the gate layer with a high-K gate dielectric layer overlaying the semiconductor substrate and a metal gate layer overlaying the high-K gate dielectric layer after forming the raised source/drain extension regions.

Preferably, the replacing step comprises the following steps: forming sidewall spacers of the stacked structure; removing the gate layer, the gate dielectric layer and the silicon-containing semiconductor layer so as to form a trench between the sidewall spacers; forming the high-K gate dielectric layer covering the bottom and sidewalls of the trench; and forming the metal gate layer partially surrounded by the high-K gate dielectric layer.

Preferably, the manufacturing method further comprises the following step: forming source/drain regions after forming the sidewall spacers.

According to this disclosure, a semiconductor device, which has source/drain extension regions with a shallow junction depth (or a small thickness) and a high activated dopant concentration, and a manufacturing method thereof can be provided.

BRIEF DESCRIPTION OF THE DRAWINGS

The accompanying drawings, which are incorporated in and constitute a part of the specification, illustrate embodiments of this disclosure and, together with the description, serve to explain the principles of this disclosure.

It is to be noted that, in the accompanying drawings, for convenience of description, the shapes of respective components are merely illustrative, and the sizes of respective components may not be drawn based on actual scales.

The features and advantages of this disclosure will become apparent from the following detailed description of exemplary embodiments with reference to the accompanying drawings.

DETAILED DESCRIPTION OF THE INVENTION

Exemplary embodiments of this disclosure will be described in detail below with reference to the accompanying drawings. It shall be noted that the following description is merely exemplary in nature. The components, steps and numerical values set forth in the embodiments do not limit the scope of this disclosure unless it is otherwise specifically stated. In addition, techniques, methods and devices known by persons skilled in the art may not be discussed in detail, but are intended to be a part of the specification where appropriate.

This disclosure will be described below by taking a transistor as an example. It is to be noted that, this disclosure is applicable not only to PMOS transistors, but also to NMOS transistors, namely, is applicable to CMOS transistors. In addition, this disclosure is also applicable to other semiconductor devices, including Replacement Gate (RMG) devices (such as finFET) and the like.

Figure 1:
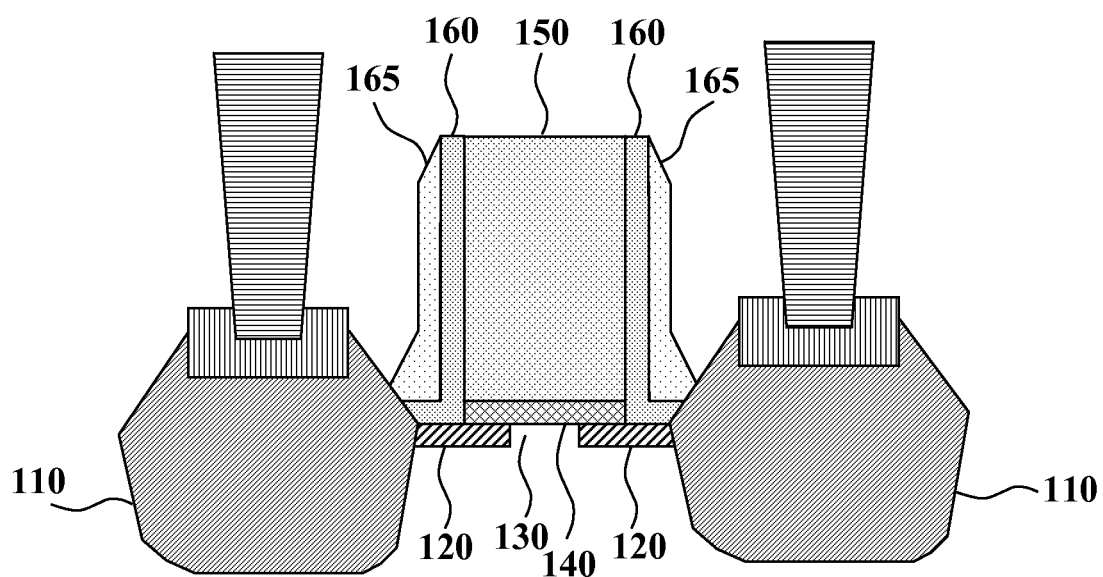
FIG. 1 schematically shows a sectional view of a conventional semiconductor device.
Figure 2:
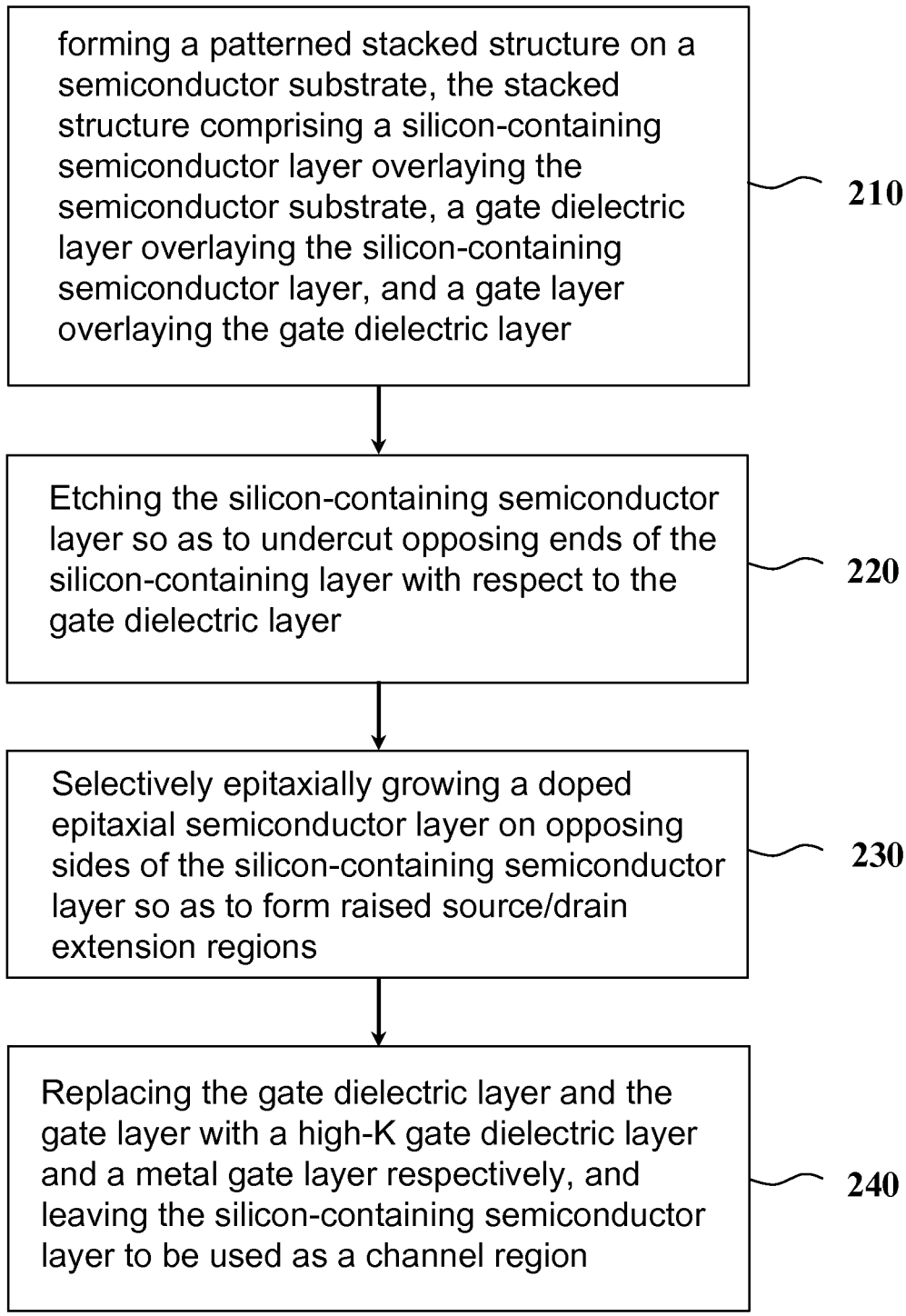
FIG. 2 schematically shows a flowchart of one embodiment of a manufacturing method of a semiconductor device according to this disclosure.

One embodiment of a manufacturing method of a semiconductor device of this disclosure will be described in detail below with reference to FIG. 2 and FIGS. 3A-3F, wherein FIG. 2 schematically shows a flowchart of the one embodiment, and FIGS. 3A-3F schematically show sectional views of respective steps in the one embodiment. It is to be noted that, not every step in FIG. 2 is necessarily indispensable, and some steps therein can be omitted as appropriate.

Figure 3A:
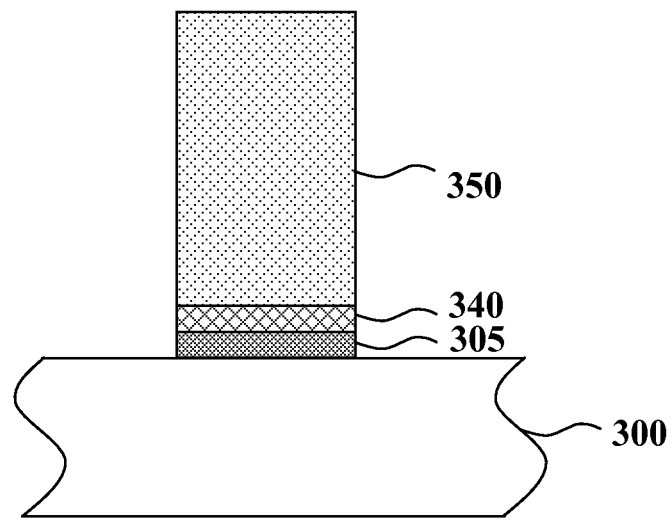
FIGS. 3A-3F schematically show sectional views of respective steps in the one embodiment of the manufacturing method of the semiconductor device according to this disclosure.

First, in step 210 of FIG. 2, a patterned stacked structure is formed on a semiconductor substrate 300, the stacked structure comprising a silicon-containing semiconductor layer 305 overlaying the semiconductor substrate 300, a gate dielectric layer 340 overlaying the silicon-containing semiconductor layer 305 and a gate layer 350 overlaying the gate dielectric layer 340 (see FIG. 3A).

The semiconductor substrate 300 may be a substrate of any kind known in the art, such as a bulk silicon substrate, a silicon-on-insulator (SOI) substrate or the like. In addition, a plurality of isolation regions, such as shallow trench isolation (STI) regions (not shown in the drawings), may be formed in the semiconductor substrate 300, for example.

The material of the silicon-containing semiconductor layer 305 is not limited particularly, so long as it is in a crystalline state and matches an epitaxial semiconductor layer to be formed later. For example, the silicon-containing semiconductor layer 305 may be a SiGe layer, in which the Ge concentration is about 30 to 40 atomic-percent. In addition, the thickness of the silicon-containing semiconductor layer 305 may be about 5 to 50 nm, for example. In some embodiments of this disclosure, the thickness of the silicon-containing semiconductor layer 305 is not larger than about 20 nm, or even not larger than about 10 nm.

The material of the gate dielectric layer 340 is not limited particularly, and it may be silicon oxide, silicon nitride or the like, for example.

The material of the gate layer 350 is not limited particularly, and it may be polycrystalline silicon, for example.

The stacked structure may be formed by deposition, patterning, etching and the like using methods known in the art.

Figure 3B:
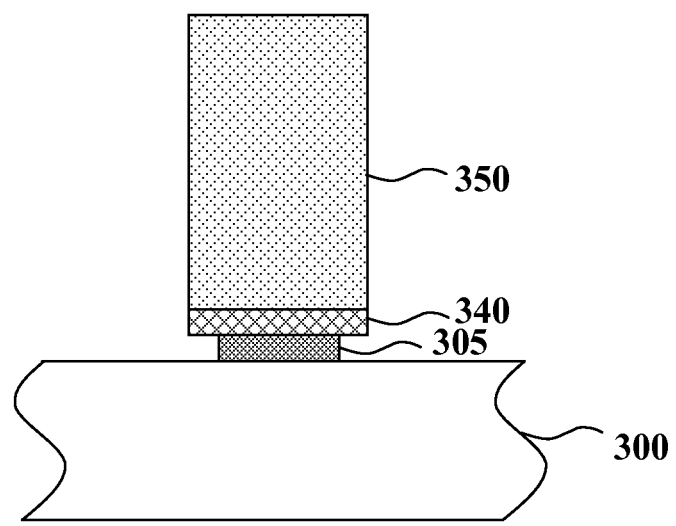

Next, in step 220 of FIG. 2, the silicon-containing semiconductor layer 305 is etched so as to undercut opposing ends of the silicon-containing semiconductor layer 305 with respect to the gate dielectric layer 340 (see FIG. 3B).

The purpose of undercutting opposing ends of the silicon-containing semiconductor layer 305 is to make the epitaxial semiconductor layer to be formed later and the gate structure overlap. For example, each end of the silicon-containing semiconductor layer 305 is undercut by a same length, such as about 5 to 10 percent of the gate length, that is, the total undercut length of the silicon-containing semiconductor layer 305 may be about 10 to 20 percent of the gate length.

When the silicon-containing semiconductor layer 305 is a SiGe layer, it may, for example, be etched by HCl vapor phase etching, in which a mixed gas of HCl and $H_2$ may be used, the partial pressure of HCl is about 0.1 to 0.9 Torr, the total pressure is not higher than about 80 Torr, and the temperature is about 500 to 700° C. The etching may, for example, be isotropic, but is not limited thereto. In one specific example, the SiGe layer may be etched by using an HCl vapor phase rapid thermal processing (RTP) tool, in which a mixed gas of HCl and $H_2$ is used, the partial pressure of HCl is about 0.4 Torr, the total pressure is about 60 Torr, and the temperature is about 600° C.

It is to be noted that, in some embodiments of this disclosure, the etching step 220 may not be performed.

Figure 3C:
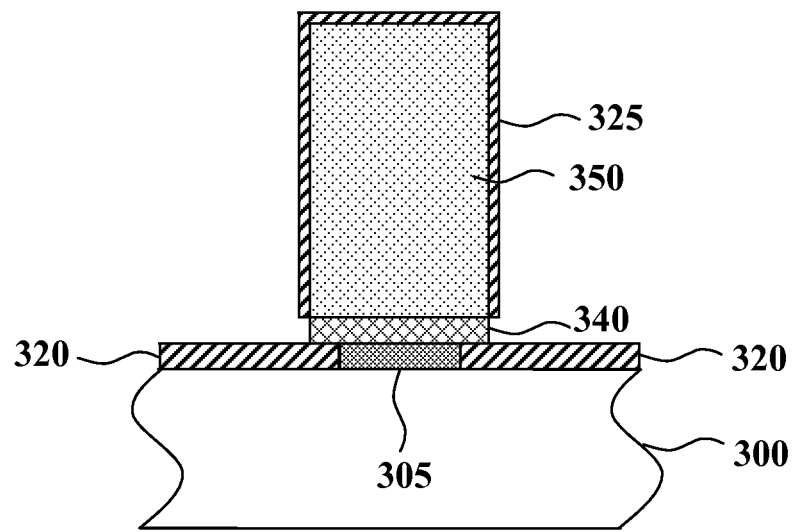

Then, in step 230 of FIG. 2, a doped epitaxial semiconductor layer 320 is selectively epitaxially grown on opposing sides of the silicon-containing semiconductor layer 305 so as to form raised source/drain extension regions (see FIG. 3C).

The selective epitaxial growing step only proceeds at positions where silicon atoms serving as 'seeds' exist. Thus, on the semiconductor substrate 300, the selective epitaxial growing step selectively epitaxially grows a doped epitaxial semiconductor layer 320 on opposing sides of the silicon-containing semiconductor layer 305. The doped epitaxial semiconductor layer 320 will form raised source/drain extension regions. In addition, the selective epitaxial growing step also forms an epitaxial semiconductor layer 325 around the gate layer 350 at the same time (the epitaxial semiconductor layer 325 may be removed in a subsequent step).

The material of the epitaxial semiconductor layer 320 is not limited particularly, and it may be Si, SiGe or the like, for example. When the material of the epitaxial semiconductor layer 320 is Si, the selective epitaxial growth may, for example, be carried out by employing the following conditions: a $H_2$ flow rate of about 10 to 50 slm, a Si source flow rate of about 100 to 300 sccm, a HCl flow rate of about 50 to 300 sccm, a flow rate of about 100 to 500 sccm of a mixture of $AsH_3$ and $H_2$ with a molar ratio of about 1:99, a mixture of $B_2H_6$ and $H_2$ with a molar ratio of about 1:99 or a mixture of $PH_3$ and $H_2$ with a molar ratio of about 1:99, a temperature of about 620 to 800° C., and a pressure of about 0.1 to 1.0 Torr. In one specific example, the selective epitaxial growth may be carried out by using a rapid thermal CVD tool with a H2 flow rate of about 30 slm, a $Si_3H_8$ (the Si source is not limited thereto) flow rate of about 300 sccm, a HCl flow rate of about 120 sccm, a flow rate of about 300 sccm of a mixture of $AsH_3$ and $H_2$ with a molar ratio of about 1:99, a mixture of $B_2H_6$ and $H_2$ with a molar ratio of about 1:99 or a mixture of $PH_3$ and $H_2$ with a molar ratio of about 1:99, a temperature of about 630° C., and a pressure of about 0.2 Torr. The type of dopants may be appropriately selected according to the type of the MOS transistor to be formed so as to selectively epitaxially grow an in situ doped epitaxial semiconductor layer 320 on opposing sides of the silicon-containing semiconductor layer 305. For example, when an NMOS transistor is to be formed, $AsH_3$ or $PH_3$ may be employed as the dopants; when a PMOS transistor is to be formed, $B_2H_6$ may be employed as the dopants.

Incidentally, a preheating treatment is preferably not carried out in the epitaxial growing step 230. This is because hydrogen and a temperature above about 800° C. are usually used in the preheating treatment, and crystal defects will be introduced at, for example, an interface between silicon oxide and the substrate (such as in the proximity of STI) even by a low temperature preheating treatment of about 800° C.

Incidentally, due to the growth of native oxides, the queue time between the etching step 220 and the epitaxial growing step 230 (that is, the time interval between the etching step 220 and the epitaxial growing step 230) is preferably not longer than about 2 hours, and more preferably, is not longer than about 1 hour.

According to the above processes, a semiconductor device is formed (see FIG. 3C). The semiconductor device comprises: a patterned stacked structure formed on a semiconductor substrate 300, the stacked structure comprising a silicon-containing semiconductor layer 305 overlaying the semiconductor substrate 300, a gate dielectric layer 340 overlaying the silicon-containing semiconductor layer 305 and a gate layer 350 overlaying the gate dielectric layer 340; and a doped epitaxial semiconductor layer 320 on opposing sides of the silicon-containing semiconductor layer 305. As will be described below, the epitaxial semiconductor layer 320 forms raised source/drain extension regions. In addition, if needed, the silicon-containing semiconductor layer 305 may be used as a channel region.

It is to be noted that, as compared to the prior arts in which the source/drain extension regions are formed by ion implantation and annealing, in this disclosure, since epitaxy is employed to form the doped epitaxial semiconductor layer 320 and thus to form the source/drain extension regions, the doping concentration of the epitaxial semiconductor layer 320 (i.e., the source/drain extension regions) may be higher (i.e., heavily doped), for example, it may be about $5.0 \times 10^{19}$ to $5.0 \times 10^{21}$ cm$^{-3}$; also, the dopants can be activated to a larger extent, thus crystal defects are less. This can advantageously reduce the accumulation resistance, thereby the driving current of the transistor is increased.

Also, as compared to the prior arts in which the source/drain extension regions are formed by ion implantation and annealing, in this disclosure, since epitaxy is employed to form the doped epitaxial semiconductor layer 320 and thus to form the source/drain extension regions, the thickness of the epitaxial semiconductor layer 320 (i.e., the source/drain extension regions) may be smaller, for example, it may be about 5 to 50 nm. In some embodiments of this disclosure, the thickness of the epitaxial semiconductor layer 320 is not larger than about 20 nm, or even not larger than about 10 nm. This can advantageously reduce the area junction capacitance, thereby performances of the transistor are improved.

In addition, laser melting/sub-melting annealing needs complicated process tuning, and the high temperature of laser melting/sub-melting annealing (e.g., may be above about 1300° C.) may introduce defects in the channel region. In comparison to this, in this disclosure in which the source/drain extension regions are formed by epitaxy, the damage to the channel region is less due to the lower temperature of epitaxy (e.g., about 620 to 800° C.).

In addition, in this disclosure, the formed source/drain extension regions are located above the surface of the semiconductor substrate 300, thus, the formed source/drain extension regions are raised source/drain extension regions. Such a structure of raised source/drain extension regions can reduce the parasitic junction capacitance, thereby performances of the transistor are improved.

Incidentally, in the prior arts in which the source/drain extension regions are formed by ion implantation and annealing, implanted dopants can not only diffuse in the longitudinal direction, but also diffuse in the lateral direction disadvantageously. In comparison to this, in this disclosure, the lengths of the source/drain extension regions can be better controlled by the amount of undercutting of the silicon-containing semiconductor layer 305.

Figure 3D:
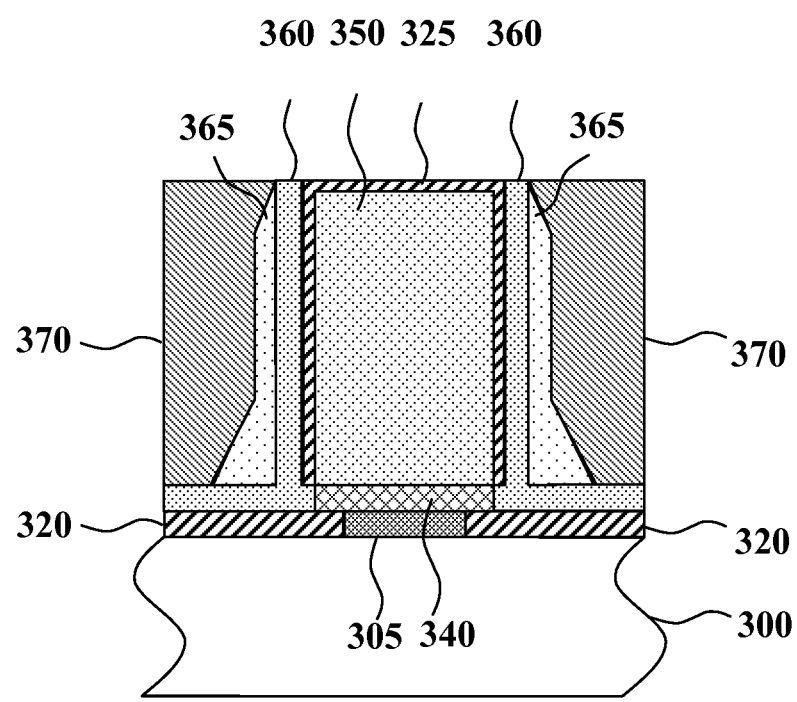
Figure 3E:
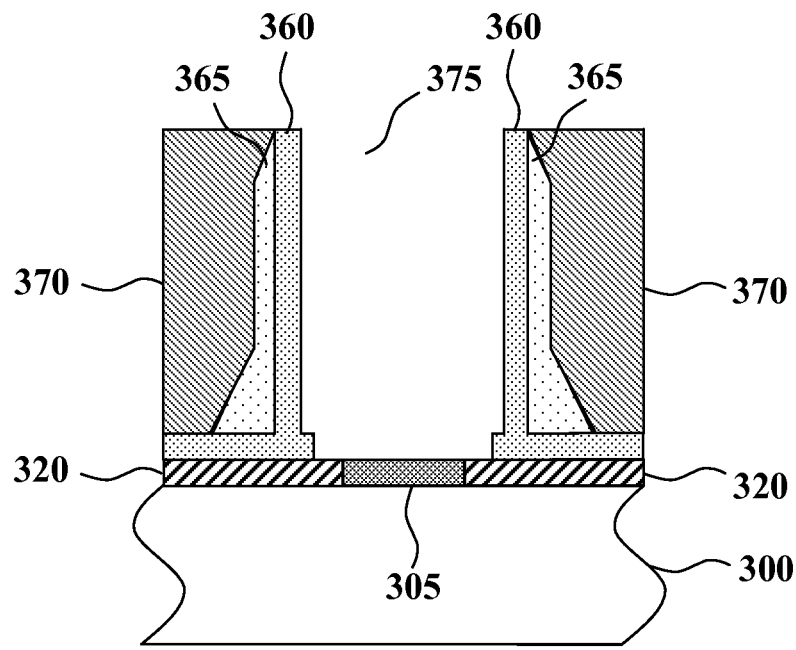
Figure 3F:
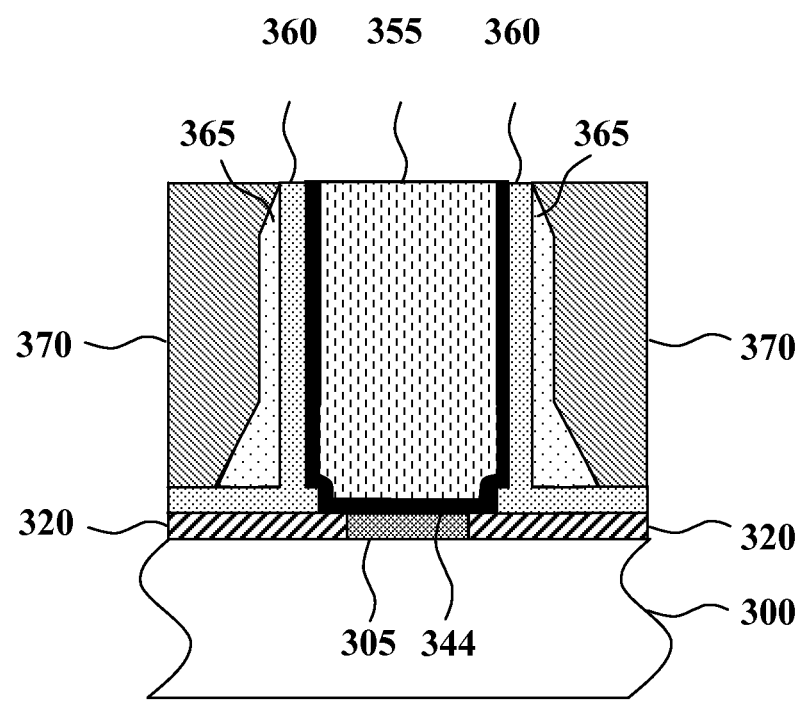

Next, in step 240 of FIG. 2, the gate dielectric layer 340 and the gate layer 350 are replaced with a high-K gate dielectric layer 344 and a metal gate layer 355 respectively, and the silicon-containing semiconductor layer 305 is left to be used as a channel region (see FIGS. 3D-3F).

Incidentally, after forming the raised source/drain extension regions, referring to FIG. 3D, sidewall spacers 360 and 365 of the stacked structure, an interlayer dielectric layer 370 and source/drain regions (not shown in the drawing) may be formed.

The materials and forming methods of the sidewall spacers 360 and 365 and the interlayer dielectric layer 370 are not limited particularly. For example, the sidewall spacers 360 and 365 may be silicon nitride and silicon oxide respectively, and may be formed by atomic layer deposition (ALD) with excellent coverage and low temperature. After forming the sidewall spacers 360 and 365 by deposition and etching, the interlayer dielectric layer 370 is deposited, and then chemical mechanical polishing (CMP) is performed so as to obtain the structure as shown in FIG. 3D.

Also, for example, source/drain regions (not shown in the drawings) may be formed immediately after forming the sidewall spacers 360 and 365 (before forming the interlayer dielectric layer 370). The source/drain regions may be formed by conventional ion implantation and annealing processes, and other kinds of source/drain regions, such as raised source/drain regions, may also be formed.

Then, the gate layer 350 and the gate dielectric layer 340 are removed, whereas the silicon-containing semiconductor layer 305 is left, so as to form a trench 375 between the sidewall spacers 360 and 365 (see FIG. 3E).

The method of removing the gate layer 350 and the gate dielectric layer 340 is not limited particularly. For example, various methods including dry etching and wet etching may be employed to selectively etch the gate layer 350 and the gate dielectric layer 340, and thus to form the trench 375. In addition, the epitaxial semiconductor layer 325 formed around the gate layer 350 is also etched.

Then, a high-K gate dielectric layer 344 and a metal gate layer 355 are sequentially formed in the trench 375 (see FIG. 3F).

The material of the high-K gate dielectric layer 344 is not limited particularly, and it may be HfO, HfSiO, LaO, ZrO, ZrSiO, TaO, BST, BaTiO, SrTiO, YO, AlO, PbScTaO, PbZnNb or the like, for example. The thickness of the high-K gate dielectric layer 344 is not larger than about 60 Å, for example. As shown in FIG. 3F, the formed high-K gate dielectric layer 344 covers not only the bottom of the trench 375, but also the sidewalls of the trench 375, that is, the high-K gate dielectric layer 344 is substantially U-shaped.

After forming the high-K gate dielectric layer 344 as a lining layer in the trench 375, deposition and planarization are carried out in the trench 375 so as to form a metal gate layer 355, thereby a structure as shown in FIG. 3F in which the high-K gate dielectric layer 344 is substantially U-shaped and the metal gate layer 355 is partially surrounded by the high-K gate dielectric layer 344 is obtained. The material of the metal gate layer 355 is not limited particularly. For example, as to an n-type metal gate layer 355, Hf, Zr, Ti, Ta, Al, HfC, ZrC, TiC, TaC, AlC or the like may be used, the work function thereof being about 3.9 to 4.2 eV, and the thickness thereof being about 100 to 2000 Å for example; as to a p-type metal gate layer 355, Ru, Pa, Pt, Co, Ni, RuO or the like may be used, the work function thereof being about 4.9 to 5.2 eV, and the thickness thereof being about 50 to 1000 Å for example.

According to the above processes, a semiconductor device is formed (see FIG. 3F). In the semiconductor device, as compared to the semiconductor devices shown in FIGS. 3C and 3D, the gate dielectric layer 340 and the gate layer 350 are replaced with the high-K gate dielectric layer 344 and the metal gate layer 355 respectively. That is, the semiconductor device comprises: a silicon-containing semiconductor layer 305 formed on the semiconductor substrate 300; a doped epitaxial semiconductor layer 320 on opposing sides of the silicon-containing semiconductor layer 305; and a stacked structure of a high-K gate dielectric layer 344 and a metal gate layer 355 formed on the silicon-containing semiconductor layer 305, wherein the epitaxial semiconductor layer 320 forms raised source/drain extension regions, and the silicon-containing semiconductor layer 305 is used as a channel region.

In the high-K dielectric last and gate last process of this disclosure, the gate dielectric layer 340 is replaced with the high-K gate dielectric layer 344 after forming the epitaxial semiconductor layer 320 used as the source/drain extension regions, thereby the degradation of the high-K gate dielectric layer caused by reductive gases in the epitaxial growth is avoided. In comparison to this, in the high-K dielectric first and gate first process, when the source/drain extension regions are formed by an epitaxy method, the high-K gate dielectric layer is degraded due to the reductive reaction of the high-K gate dielectric layer caused by reductive gases in the epitaxial growth.

It is to be noted that, in some embodiments of this disclosure, the replacing step 240 may not be performed.

In addition, in the semiconductor device as shown in FIGS. 3C, 3D and 3F of this disclosure, when the silicon-containing semiconductor layer 305 is a SiGe layer, the formed channel region is a SiGe channel region, since the silicon-containing semiconductor layer 305 is used as the channel region.

When the semiconductor device is a PMOS transistor, carrier mobility can be improved advantageously by the formed SiGe channel region.

When the semiconductor device is an NMOS transistor, if a SiGe channel region is undesirable, optionally, the silicon-containing semiconductor layer 305 which is a SiGe layer may also be removed in the replacing step 240. That is, optimization processes may be carried out for the PMOS and NMOS transistors separately.

Figure 4:
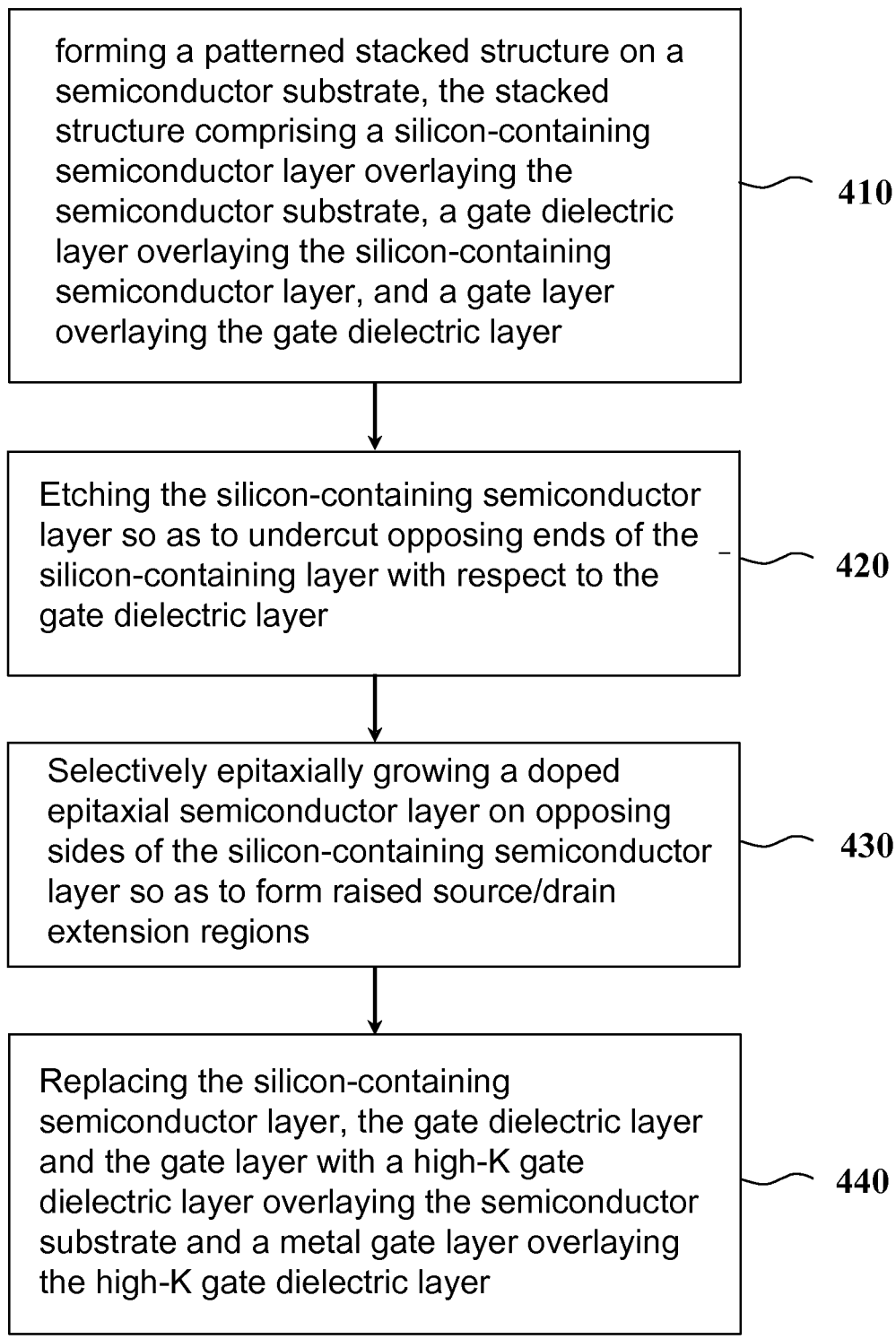
FIG. 4 schematically shows a flowchart of another embodiment of the manufacturing method of the semiconductor device according to this disclosure.
Figure 5A:
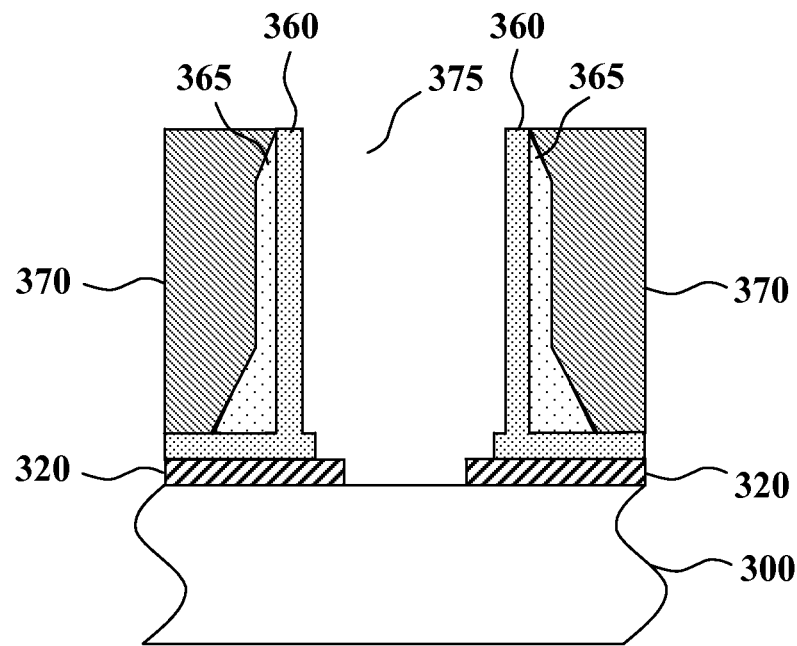
FIGS. 5A-5B schematically show sectional views of some steps in the another embodiment of the manufacturing method of the semiconductor device according to this disclosure.
Figure 5B:
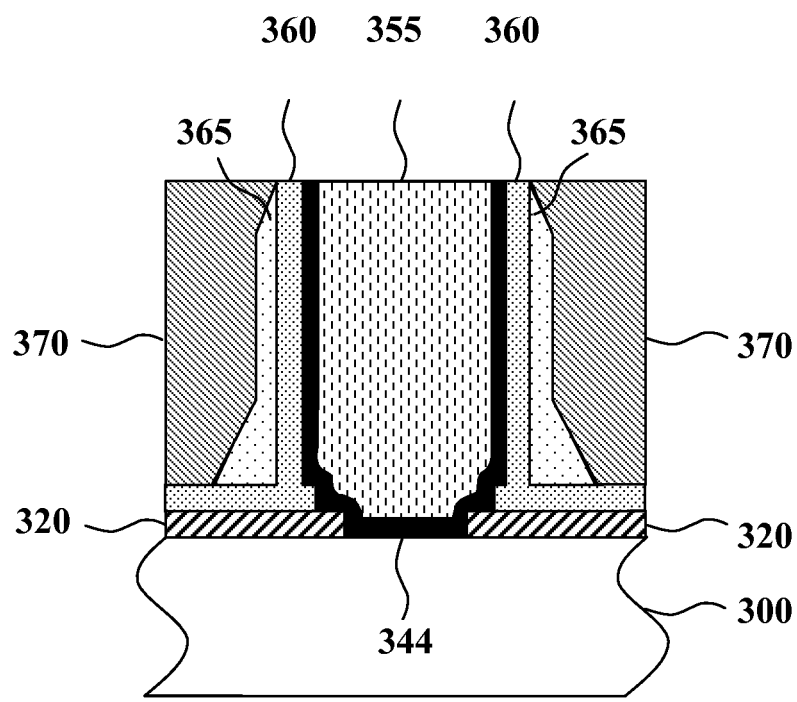

In the embodiment described above with reference to FIGS. 2 and 3A-3F, in the replacing step 240, only the gate layer 350 and the gate dielectric layer 340 are removed, whereas the silicon-containing semiconductor layer 305 is left (see FIG. 3E). However, this is not limited thereto. Next, another embodiment of this disclosure will be described briefly with reference to FIGS. 4 and 5A-5B, wherein FIG. 4 schematically shows a flowchart thereof, and FIGS. 5A-5B schematically show sectional views of some steps thereof. The only difference between the embodiment shown in FIGS. 2 and 3A-3F and that shown in FIGS. 4 and 5A-5B lies in that the silicon-containing semiconductor layer 305 is also removed during the replacing step in the latter embodiment. Hereinafter, only the difference between the two embodiments will be described in detail; their other parts are the same, thus related description is omitted.

It can be seen from FIG. 4 that all steps are the same as those in FIG. 2 except for step 440. Therefore, for convenience, FIGS. 5A-5B only show the sectional views of the steps which are different from those in the former embodiment, and they correspond to FIGS. E-3F respectively. In addition, in FIGS. 5A-5B, the same reference signs as those in FIGS. 3E-3F represent the same components.

More specifically, in step 440 of FIG. 4, the silicon-containing semiconductor layer 305, the gate dielectric layer 340 and the gate layer 350 are replaced with a high-K gate dielectric layer 344 overlaying the semiconductor substrate 300 and a metal gate layer 355 overlaying the high-K gate dielectric layer 344 (see FIGS. 5A-5B).

As shown in FIG. 5A, the gate layer 350, the gate dielectric layer 340 and the silicon-containing semiconductor layer 305 are removed so as to form a trench 375 between the sidewall spacers 360 and 365.

The method of removing the gate layer 350, the gate dielectric layer 340 and the silicon-containing semiconductor layer 305 is not limited particularly. For example, various methods including dry etching and wet etching may be employed to selectively etch the gate layer 350, the gate dielectric layer 340 and the silicon-containing semiconductor layer 305, and thus to form the trench 375. In addition, the epitaxial semiconductor layer 325 formed around the gate layer 350 is also etched.

As shown in FIG. 5B, a high-K gate dielectric layer 344 and a metal gate layer 355 are sequentially formed in the trench 375.

According to the above processes, a semiconductor device is formed (see FIG. 5B). In the semiconductor device, as compared to the semiconductor devices shown in FIGS. 3C and 3D, the silicon-containing semiconductor layer 305, the gate dielectric layer 340 and the gate layer 350 are replaced with the high-K gate dielectric layer 344 and the metal gate layer 355. That is, the semiconductor device comprises: a stacked structure of a high-K gate dielectric layer 344 and a metal gate layer 355 formed on a semiconductor substrate 300; and a doped epitaxial semiconductor layer 320 on the semiconductor substrate 300 and on opposing sides of the stacked structure of the high-K gate dielectric layer 344 and the metal gate layer 355, wherein the epitaxial semiconductor layer 320 forms raised source/drain extension regions.

Like the replacing step 240, the replacing step 440 may not be performed in some embodiments of this disclosure.

Up to now, the semiconductor device and the manufacturing method thereof of this disclosure have been described in detail. Some details well known in the art are not described in order to avoid obscuring the concept of this disclosure. Persons skilled in the art can easily understand how to implement the technical solutions disclosed herein according to the above description.

While this disclosure has been described with reference to exemplary embodiments, it shall be understood that this disclosure is not limited to the disclosed exemplary embodiments. It is obvious to persons skilled in the art that the above exemplary embodiments may be modified without deviating from the scope and spirit of this disclosure. The scope of the appended claims shall be accorded with the broadest interpretation so as to encompass all such modifications and equivalent structures and functions.

What is claimed is:

1. A manufacturing method of a semiconductor device, the manufacturing method comprising the following steps:
   forming a patterned stacked structure on a semiconductor substrate, the stacked structure comprising a silicon-containing semiconductor layer overlaying the semiconductor substrate, a gate dielectric layer overlaying the silicon-containing semiconductor layer, and a gate layer overlaying the gate dielectric layer;
   selectively epitaxially growing a doped epitaxial semiconductor layer on opposite sides of the silicon-containing semiconductor layer so as to form raised source/drain extension regions;
   forming an epitaxial semiconductor member that directly contacts at least two sides of the gate layer;
   removing the epitaxial semiconductor member; and
   replacing the gate dielectric layer and the gate layer with a high-K gate dielectric layer and a metal gate layer respectively, and leaving the silicon-containing semiconductor layer to be used as a channel region.

2. The manufacturing method according to claim 1, wherein a doping concentration of the epitaxial semiconductor layer is in a range of about $5.0 \times 10^{19}$ to $5.0 \times 10^{21}$ cm$^{-3}$, and wherein a thickness of the epitaxial semiconductor layer is in a range of 5 to 50 nm.

3. The manufacturing method according to claim 1, wherein the silicon-containing semiconductor layer is a SiGe layer, and the Ge concentration is in a range of about 30 to 40 atomic-percent.

4. The manufacturing method according to claim 1, wherein the selectively epitaxially growing the doped epitaxial semiconductor layer and the forming the epitaxial semiconductor member are performed in a same process step, and wherein the doped epitaxial semiconductor layer remains on the semiconductor substrate after the epitaxial semiconductor member has been removed.

5. The manufacturing method according to claim 1, wherein the epitaxial semiconductor member and the gate layer are removed in a same process step.

6. The manufacturing method according to claim 5, wherein the epitaxial semiconductor layer is grown using selective epitaxial growth conditions that include a H$_2$ flow rate in a range of about 10 to 50 slm, a Si source flow rate in a range of about 100 to 300 sccm, a HCl flow rate in a range of about 50 to 300 sccm, a flow rate in a range of about 100 to 500 sccm of a mixture of AsH$_3$ and H$_2$ with a molar ratio of about 1:99, a mixture of B$_2$H$_6$ and H$_2$ with a molar ratio of about 1:99 or a mixture of PH$_3$ and H$_2$ with a molar ratio of about 1:99, a temperature in a range of about 620 to 800° C., and a pressure in a range of about 0.1 to 1.0 Torr.

7. The manufacturing method according to claim 1, further comprising the following step:
   etching the silicon-containing semiconductor layer after forming the stacked structure and before forming the raised source/drain extension regions so as to undercut opposing ends of the silicon-containing semiconductor layer with respect to the gate dielectric layer, wherein a total undercut length of the silicon-containing semiconductor layer is in a range of about 10 to 20 percent of a gate length.

8. The manufacturing method according to claim 7, wherein the silicon-containing semiconductor layer is a SiGe layer, and the Ge concentration is in a range of about 30 to 40 atomic-percent; and
   the etching is performed by HCl vapor phase etching, wherein a mixed gas of HCl and H$_2$ is used, the partial pressure of HCl is in a range of about 0.1 to 0.9 Torr, the total pressure is not higher than about 80 Torr, and the temperature is in a range of about 500 to 700° C.

9. The manufacturing method according to claim 1, wherein the replacing step comprises the following steps:
   forming sidewall spacers of the stacked structure; removing the gate layer and the gate dielectric layer so as to form a trench between the sidewall spacers;
   forming the high-K gate dielectric layer covering the bottom and sidewalls of the trench; and
   forming the metal gate layer partially surrounded by the high-K gate dielectric layer.

10. The manufacturing method according to claim 9, further comprising the following step:
    forming source/drain regions after forming the sidewall spacers.

11. A manufacturing method of a semiconductor device, the manufacturing method comprising the following steps:
    forming a patterned stacked structure on a semiconductor substrate, the stacked structure comprising a silicon-containing semiconductor layer overlaying the semiconductor substrate, a gate dielectric layer overlaying the silicon-containing semiconductor layer, and a gate layer overlaying the gate dielectric layer;
    selectively epitaxially growing a doped epitaxial semiconductor layer on opposite sides of the silicon-containing semiconductor layer so as to form raised source/drain extension regions;
    when growing the doped epitaxial semiconductor layer, forming an epitaxial semiconductor member that directly contacts at least two sides of the gate layer; and
    removing the epitaxial semiconductor member.

12. A manufacturing method of a semiconductor device, the manufacturing method comprising the following steps:
    forming a patterned stacked structure on a semiconductor substrate, the stacked structure comprising a silicon-containing semiconductor layer overlaying the semiconductor substrate, a gate dielectric layer overlaying the silicon-containing semiconductor layer, and a gate layer overlaying the gate dielectric layer;
    selectively epitaxially growing a doped epitaxial semiconductor layer on opposite sides of the silicon-containing semiconductor layer so as to form raised source/drain extension regions;
    forming an epitaxial semiconductor member that directly contacts a sidewall of the gate layer; removing the epitaxial semiconductor member; and
    retaining the doped epitaxial semiconductor layer on the semiconductor substrate when removing the epitaxial semiconductor member.

13. The manufacturing method according to claim 12, wherein a doping concentration of the epitaxial semiconductor layer is in a range of about $5.0 \times 10^{19}$ to $5.0 \times 10^{21}$ cm$^{-3}$.

14. The manufacturing method according to claim 12, wherein a thickness of the epitaxial semiconductor layer is in a range of about 5 to 50 nm.

15. The manufacturing method according to claim 12, wherein the silicon-containing semiconductor layer is a SiGe layer, and the Ge concentration is in a range of about 30 to 40 atomic-percent.

16. The manufacturing method according to claim 12, further comprising: forming a sidewall spacer at a side of the patterned stacked structure such that a portion of the epitaxial semiconductor member is disposed between the patterned stacked structure and the sidewall spacer.

17. The manufacturing method according to claim 16, wherein the epitaxial semiconductor layer is grown using selective epitaxial growth conditions that include a $H_2$ flow rate in a range of about 10 to 50 slm, a Si source flow rate in a range of about 100 to 300 sccm, a HCl flow rate in a range of about 50 to 300 sccm, a flow rate in a range of about 100 to 500 sccm of a mixture of $AsH_3$ and $H_2$ with a molar ratio of about 1:99, a mixture of $B_2H_6$ and $H_2$ with a molar ratio of about 1:99 or a mixture of $PH_3$ and $H_2$ with a molar ratio of about 1:99, a pressure in a range of 0.1 to 1.0 Torr, and a temperature in a range of about 620 to 800° C.

18. The manufacturing method according to claim 12, further comprising the following step:
  etching the silicon-containing semiconductor layer after forming the stacked structure and before forming the raised source/drain extension regions so as to undercut opposing ends of the silicon-containing semiconductor layer with respect to the gate dielectric layer,
  wherein a total undercut length of the silicon-containing semiconductor layer is in a range about 10 to 20 percent of a gate length.

19. The manufacturing method according to claim 18, wherein the silicon-containing semiconductor layer is a SiGe layer, and the Ge concentration is in a range of about 30 to 40 atomic-percent; and the etching is performed by HCl vapor phase etching, wherein a mixed gas of HCl and $H_2$ is used, the partial pressure of HCl is in a range of about 0.1 to 0.9 Torr, the total pressure is not higher than about 80 Torr, and the temperature is in a range of about 500 to 700° C.

20. The manufacturing method according to claim 12, further comprising the following step:
  replacing the silicon-containing semiconductor layer, the gate dielectric layer and the gate layer with a high-K gate dielectric layer overlaying the semiconductor substrate and a metal gate layer overlaying the high-K gate dielectric layer after forming the raised source/drain extension regions.

21. The manufacturing method according to claim 20, wherein the replacing step comprises the following steps:
  forming sidewall spacers of the stacked structure;
  removing the gate layer, the gate dielectric layer and the silicon-containing semiconductor layer so as to form a trench between the sidewall spacers;
  forming the high-K gate dielectric layer covering the bottom and sidewalls of the trench; and
  forming the metal gate layer partially surrounded by the high-K gate dielectric layer.

22. The manufacturing method according to claim 21, further comprising the following step: forming source/drain regions after forming the sidewall spacers.

* * * * *